United States Patent
Laird et al.

(10) Patent No.: US 8,217,260 B2
(45) Date of Patent: Jul. 10, 2012

(54) ORGANIC PHOTOVOLTAIC DEVICES COMPRISING FULLERENES AND DERIVATIVES THEREOF

(75) Inventors: Darin W. Laird, Pittsburgh, PA (US); Reza Stegamat, Blawnox, PA (US); Malika Daadi, legal representative, Blawnox, PA (US); Henning Richter, Newton, MA (US); Viktor Vejins, Concord, MA (US); Larry Scott, Newton, MA (US); Thomas A. Lada, Brighton, MA (US)

(73) Assignees: Plextronics, Inc., Pittsburgh, PA (US); Nano-C, Inc., Westwood, MA (US)

(*) Notice: Subject to any disclaimer, the term of this patent is extended or adjusted under 35 U.S.C. 154(b) by 994 days.

(21) Appl. No.: 11/743,587

(22) Filed: May 2, 2007

(65) Prior Publication Data
US 2010/0132782 A1 Jun. 3, 2010

Related U.S. Application Data

(60) Provisional application No. 60/812,961, filed on Jun. 13, 2006.

(51) Int. Cl.
*H01L 31/00* (2006.01)

(52) U.S. Cl. ........ 136/263; 136/256; 136/244; 252/500; 252/501.1; 252/502; 252/510; 257/E31.001; 257/40; 438/57; 977/734; 977/735; 977/737; 977/778; 977/784

(58) Field of Classification Search .................. 252/500, 252/501.1, 502, 510; 136/263, 256, 244; 257/E31.001, 40; 438/57; 977/734, 735, 977/737, 778, 784
See application file for complete search history.

(56) References Cited

U.S. PATENT DOCUMENTS

| | | | |
|---|---|---|---|
| 5,273,729 A | 12/1993 | Howard et al. | |
| 5,294,372 A | 3/1994 | Kochem et al. | |
| 5,331,183 A | 7/1994 | Sariciftci et al. | |
| 5,401,537 A | 3/1995 | Kochem et al. | |
| 5,985,232 A | 11/1999 | Howard et al. | |
| 6,162,411 A | 12/2000 | Howard et al. | |
| 6,166,172 A | 12/2000 | McCullough et al. | |
| 6,454,880 B1 | 9/2002 | Rickman, Jr. | |
| 6,602,974 B1 | 8/2003 | McCullough et al. | |
| 7,147,936 B2 | 12/2006 | Louwet et al. | |
| 2004/0179989 A1 | 9/2004 | Height et al. | |
| 2005/0098205 A1* | 5/2005 | Roscheisen et al. | 136/263 |

(Continued)

FOREIGN PATENT DOCUMENTS

DE 4312475 A1 10/1994

(Continued)

OTHER PUBLICATIONS

Komatsu et al. ("Novel nucleophilic addition reactions leading to new derivatives of fullerene C60." Fullerenes. vol. 3, pp. 1200-1211, 1996).*

(Continued)

*Primary Examiner* — Mark Kopec
*Assistant Examiner* — Tri V Nguyen
(74) *Attorney, Agent, or Firm* — Foley & Lardner LLP

(57) ABSTRACT

Photovoltaic cells comprising an active layer comprising, as p-type material, conjugated polymers such as polythiophene and regioregular polythiophene, and as n-type material at least one fullerene derivative. The fullerene derivative can be C60, C70, or C84. The fullerene also can be functionalized with indene groups. Improved efficiency can be achieved.

37 Claims, 4 Drawing Sheets

A typical conductive polymer photovoltaic (solar) cell

U.S. PATENT DOCUMENTS

| | | |
|---|---|---|
| 2005/0263183 A1 | 12/2005 | Nishikitani et al. |
| 2005/0279399 A1 | 12/2005 | Gaudiana et al. |
| 2006/0076050 A1 | 4/2006 | Williams et al. |
| 2006/0175582 A1 | 8/2006 | Hammond et al. |
| 2006/0237695 A1 | 10/2006 | Williams et al. |
| 2006/0278867 A1 | 12/2006 | McCullough et al. |
| 2007/0082140 A1* | 4/2007 | Suzuki et al. ............. 427/402 |
| 2008/0319207 A1 | 12/2008 | Laird et al. |
| 2009/0176994 A1 | 7/2009 | Laird et al. |

FOREIGN PATENT DOCUMENTS

| | | |
|---|---|---|
| EP | 1 566 845 A | 8/2005 |
| JP | 2005-116617 A | 4/2005 |
| JP | 2005-263692 A | 9/2005 |
| WO | WO 03/021018 | 3/2003 |
| WO | WO 2007/011739 | 1/2007 |
| WO | WO 2008/018931 A2 | 2/2008 |

OTHER PUBLICATIONS

Taylor et al. ("The chemistry of fullerenes." Nature, vol. 363, pp. 685-693, Jun. 24, 1993).*
Diederich et al. (Templated Regioselective and Stereoselective Synthesis in Fullerene Chemistry. Acc. Chem. Res, 32, pp. 537-545, online Mar. 2, 1999).*
Huang et al. "Reactions of C60 with nucleophilic reagents." Chinese Sc Bull., 39(10), pp. 823-826, May 1994.*
Lin et al. "Synthesis and characterization of the monoadduct C60(C9H7-C9H7) formed in Diels-Alder cycloaddition of C60 with 1,1'-biindene." Acta Chim Sinica, 59(12), pp. 2197-2201, pub 2001.*
International Search Report and Written Opinion mailed May 28, 2010 in International Application No. PCT/US2008/087850 (17 pgs.).
U.S. Appl. No. 60/915,632, filed May 2, 2007, Sheina et al.
U.S. Appl. No. 60/812,961, filed Jun. 13, 2006, Laird et al.
Backer, S. A., et al., "High Efficiency Organic Photovoltaics Incorporating a New Family of Soluble Fullerene Derivatives", Chem. Mater., vol. 19, pp. 2927-2929 (2007).
Belik, P., et al., "Reaction of Bauckminsterfullerene with ortho-Quinodimethane: a New Access to Stable $C_{60}$ Derivatives", Angew. Chem. Int. Ed. Engl., vol. 32, No. 1, pp. 78-80 (1993).
Birkett, P. R.; et al., "Preparation and $^{13}$C NMR Spectroscopic Characterization of $C_{60}Cl_6$,",J. Chem. Soc., Chem. Commun., pp. 1230-1232 (1993).
Cioslowski, J., et al., "Standard Enthalpies of Formation of Fullerenes and Their Dependence on Structural Motifs", J. Am. Chem. Soc., vol. 122, pp. 8265-8270 (2000).
Dennler et al., "Flexible Conjugated Polymer-Based Plastic Solar Cells: From Basics to Applications," Proceedings of the IEEE, vol. 93, No. 8, pp. 1429-1439 (2005).
Diener, M. D., et al., "Synthesis of Single-Walled Carbon Nanotubes in Flames," J. Phys. Chem. B, vol. 104, pp. 9615-9620 (2000).
Dresselhaus, M. S., et al., "Science of Fullerenes and Carbon Nanotubes," Academic Press, pp. 870-917 (1996).
Height, M. J., et al., "Flame Synthesis of Single-Walled Carbon Nanotubes," Carbon, vol. 42, pp. 2295-2307 (2004).
Height, M. J., et al., "Flame Synthesis of Single-walled Carbon Nanotubes," Proc. Combust. Inst., vol. 30, pp. 2537-2543 (2005).
Hirsch, A.; et al., "Chemistry and Reactions," Wiley-VCH Verlag, Weinheim, 2005.
Hirsch, A.; et al., "Fullerenes: Chemistry and Reactions," Wiley-Vch Verlag, Weinheim, Chapter 4, pp. 101-183 (2005).
Hoppe, H., et al., "Organic solar cells: An overview", J. Mater. Res., vol. 19, No. 7, pp. 1924-1945 (2004).
Howard, J. B., "Fullerenes Formation in Flames", Proc. Combust. Inst., vol. 24, pp. 933-946 (1992).
Howard, J. B., et al., "Carbon Shells in Flames," Nature, vol. 370, pp. 603-604 (1994).
Howard, J. B., et al., "Fullerenes $C_{60}$ and $C_{70}$ in Flames," Nature, vol. 352, pp. 139-141 (1991).
Howard, J. B., et al., "Fullerenes Synthesis in Combustion," Carbon, vol. 30, pp. 1183-1201 (1992).
Howard, J. B., et al.,"Production of $C_{60}$ and $C_{70}$ Fullerenes in Benzene-oxygen Flames," J. Phys. Chem. 1992a, vol. 96, pp. 6657-6662. (1992).
Hummelen, J. C.; et al.,"Preparation and Characterization of Fulleroid and Methanofullerene Derivatives," J. Org. Chem., vol. 60, pp. 532-538 (1995).
Inoue, K., et al., "High Efficiency P3HT/PCBM Solar Cell," Mater. Res. Symp. Proc., vol. 836, pp. 69-80 (2005).
Kadish, K. M.; et al.,"Fullerenes: Chemistry, Physics and Technology," Wiley-Interscience, New York, 2000.
Kim, J., "Assemblies of conjugated polymers. Intermolecular and intramolecular effects on the photophysical properties of conjugated polymers", Pure Appl. Chem., vol. 74, No. 11, pp. 2031-2044, (2002).
Kitagawa, T.; et al.,"Electrophilic Addition of Polychloroalkanes to $C_{60}$: Direct Observation of Alkylfullerenyl Cation Intermediates," J. Am. Chem. Soc., vol. 121, 4298-4299 (1999).
Koster, L. J. A.; et al., "Ultimate Efficiency of Polymer/Fullerene Bulk Heterojunction Solar Cells," Appl. Phys. Lett., vol. 88, pp. 093511-093511-3 (2006).
Krätschmer, W., et al., "Solid $C_{60}$: A New Form of Carbon," Nature, vol. 347, pp. 354-358 (1990).
Lamparth, I., et al., "Water-soluble Malonic Acid Derivatives of $C_{60}$ with a Defined Three-dimensional Structure Has Been Demonstrated Successfully," J. Chem. Soc., Chem. Commun., pp. 1727-1728 (1994).
Li, G., et al., "High-efficiency solution processable polymer photovoltaic cells by self-organization of polymer blends", Nature of Materials, vol. 4, pp. 864-868 (2005).
Loewe, R. S., et al. "A Simple Method to Prepare Head-to-Tail Coupled, Regioregular Poly(3-alkylthiophenes) Using Grignard Metathesis", Adv. Mater., vol. 11, pp. 250-253 (1999).
March, J., Advanced Organic Chemistry, "Reactions, Mechanisms, and Structure", $2^{nd}$ Ed., (1977).
McCullough, R. D.; et al., "Self-Orienting Head-to-Tail Poly(3-alkylthiophenes): New Insights on Structure-Property Relationships in Conducting Polymers", J. Am. Chem. Soc. , vol. 115, pp. 4910-4911 (1993).
Perlin, J., "The Silicon Solar Cell Turns 50," NREL, Report No. BR-520-339047 (4 pages)(2004).
Puplovskis, A., et al., "New Route for [60]Fullerene Functionalisation in [4+2] Cycloadditioni Reaction Using Indene", Tetrahedron Letters, vol. 38, No. 2, pp. 285-288 (1997).
Reyes-Reyes, M., et al., "High-efficiency photovoltaic devices based on annealed poly(3-hexylthiophene) and 1-(3-methoxycarbonyl)-propyl-1-phenyl-(6,6)$C_{61}$ blends", App. Phys. Let., vol. 87, pp. 08350-083506-3 (2005).
Reyes-Reyes, M., et al., "Meso-Structure Formation for Enhanced Organic Photovoltaic Cells", Organic Letts, vol. 7, pp. 5749-5752 (2005).
Richter, H., et al., "A. Combustion Synthesis of Fullerenes," Mat. Res. Soc. Symp. Proc., vol. 359, pp. 17-22 (1995).
Richter, H., et al., "A. Fabrication of Fullerenes in Benzene/Oxygen/ Argon- and Benzene/Acetylene/Oxygen/Argon Flames," J. Chim. Phys., vol. 92, pp. 1272-1285 (1995).
Richter, H., et al., "Addition of HCI, $CI_2$, $CoCI_2$ and KI to Fullerene Forming Benzene/oxygen/argon Flames," Synthetic Metals, vol. 77, pp. 217-221 (1996).
Richter, H., et al., "Detailed Modeling of PAH and Soot Formation in a Laminar Premixed Benzene/Oxygen/Argon Low-Pressure Flame," Proc. Combust. Inst., vol. 30, pp. 1397-1405 (2005).
Richter, H., et al., "Formation and Consumption of Single-Ring Aromatic Hydrocarbons and their Precursors in Premixed Acetylene, Ethylene and Benzene Flames," Phys. Chem. Chem. Phys., vol. 4, pp. 2038-2055 (2002).
Richter, H., et al., "Formation Mechanism of Polycyclic Aromatic Hydrocarbons and Fullerenes in Premixed Benzene Flames," Combust. Flame, vol. 119, pp. 1-22 (1999).
Richter, H., et al., "Formation of Nanotubes in Low-pressure Hydrocarbon Flames," Carbon, vol. 34, pp. 427-429 (1996).
Richter, H., et al., "Formation of Polycyclic Aromatic Hydrocarbons and their Radicals in a Nearly Sooting Premixed Benzene Flame," Proc. Combust. Inst., vol. 28, pp. 2609-2618 (2000).

Richter, H., et al., "From Academic Soot Research to Commercial Synthesis of Single-walled Carbon Nanotubes," AICHE Fall Meeting, Cincinnati, pp. 1-8 (2005).

Richter, H., et al., "Generation of Higher Fullerenes in Flames," *J. Phys. Chem. B*, vol. 101, pp. 1556-1560 (1997).

Richter, H., et al., "Industrial Production of Fullerenic Materials," *Prepr. Pap.—Am. Chem. Soc., Div. Fuel Chem.*, vol. 51, No. 1, pp. 91-92 (2006).

Ruoff, R. S., et al., "Solubility of $C_{60}$ in a Variety of Solvents," *J. Phys. Chem.*, vol. 97, pp. 3379-3383 (1993).

Skotheim, T. A., *Handbook of Conducting Polymers*, $3^{rd}$ Ed. (two vol.), 2007.

Smith, M. B. and March, J., *March's Advanced Organic Chemistry*, "Reactions, Mechanisms, and Structure", 5th Ed, (2001).

Tebbe, F. N., et al., "Synthesis and Single-Crystal X-ray Structure of a Highly Symmetrical $C_{60}$ Derivative, $C_{60}Br_{24}$," *Science*, vol. 256, pp. 822-825 (1992).

Van Mullekom, H.A.M., et al., "Developments in the chemistry and band gap engineering of donor-acceptor acceptor substituted conjugated polymers", *Materials Science and Engineering*, vol. 32 pp. 1-40 (2001).

Wienk, M. M., et al., "Efficient Methano[70]fullerene/MDMO-PPV Bulk Heterojunction Photovoltaic Cells," *Angew. Chem. Int. Ed.*, vol. 42, pp. 3371-3375 (2003).

Yu, J., et al., "Accurate and Efficient Method for Predicting Thermochemistry of Polycyclic Aromatic Hydrocarbons—Bond Centered Group Additivity," *J. Am. Chem. Soc.*, vol. 126, pp. 12685-12700 (2004).

Camaioni et al., "Solar cells based on poly(3-alkyl)thiophenes and [60]fullerene: a comparative study", J. Maters. Chem., vol. 12, pp. 2065-2070 (2002).

Imahori et al., "Donor-Linked Fullerenes: Photoinduced Electron Transfer and Its Potential Application", Adv. Mater., vol. 9, No. 7, pp. 537-546 (1997).

Waldauf et al., "Efficient charge carrier transfer from m-LPPP to C60 derivatives", Optical Maters., vol. 9, pp. 449-453 (1998).

Riedel et al., "Diphenylmethanofullerenes: New and Efficient Acceptors in Bulk-Heterojunction Solar Cells", Adv. Funct. Mater., vol. 15, pp. 1979-1987 (2005).

Neugebauer et al., "Photophysics and photovoltaic device properties of phthalocyanine-fullerene dyad:conjugates polymer mixtures", Solar Energy Maters. & Solar Cells, vol. 83, No. 2-3, pp. 201-209 (2004).

Segura et al., "Design, synthesis and photovoltaic properties of [60]fullerene based molecular materials", Maters. Sci. and Engin., vol. 25, pp. 835-842 (2005).

Wang et al., "Polymers containing fullerene or carbon nanotube structures", Prog. Polym. Sci., vol. 29, pp. 1079-1141 (2004).

Puplovskis et al., "New Route for [60] Fullerene Functionalization in [4+2] Cycloaddition Reaction Using Indene", Tetradedron Letts., vol. 38, No. 2, pp. 285-288 (1997).

PCT/US2007/010533, filed May 2, 2007, Intl. Search Report & Written Opinion dated Feb. 13, 2008 (16 pages).

\* cited by examiner

Figure 1: A typical conductive polymer photovoltaic (solar) cell

ORGANIC PHOTOVOLTAIC DEVICES COMPRISING FULLERENES AND DERIVATIVES THEREOF

CROSS REFERENCE TO RELATED APPLICATIONS

This application claims priority to U.S. provisional application Ser. No. 60/812,961 filed Jun. 13, 2006 to Laird et al., which is hereby incorporated by reference in its entirety.

BACKGROUND

A need exists to provide better materials and processes for organic photovoltaic (OPV) devices. This is driven in part by ongoing high fuel prices and unstable fuel supply. OPV devices can provide improvements over older silicon devices. See for example Perlin, John "The Silicon Solar Cell Turns 50" NREL 2004; see also, Dennler et al., "Flexible Conjugated Polymer-Based Plastic Solar Cells: From Basics to Applications," *Proceedings of the IEEE*, vol. 93, no. 8, Aug. 2005, 1429-1439. Global climate change is also a motivating factor. While it is known that conducting polymers, or conjugated polymers, including for example polythiophenes can be combined with C60 fullerene to provide useful active materials in OPV devices, a need yet remains to improve device efficiency and other important PV parameters. In particular, regioregular polythiophenes are of particular importance because of their nanoscale morphology which can be applied to novel morphologies for solar cell applications.

SUMMARY

Provided herein are, among other things, compositions, devices, methods of making, and methods of using.

For example, provided herein is a composition comprising a mixture comprising: (i) at least one p-type material, (ii) at least one n-type material, wherein the n-type material comprises a fullerene derivative represented by:

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

Another embodiment provides a composition comprising a mixture comprising: (i) at least one p-type material, (ii) at least one n-type material, wherein the n-type material comprises at least one fullerene derivative comprising at least one [6,6] fullerene bonding site wherein both carbon atoms of the [6,6] bonding site are covalently bonded to a group R.

Another embodiment provides a composition comprising a mixture comprising: (i) at least one p-type material, (ii) at least one n-type material, wherein the n-type material comprises a fullerene derivative comprising at least one fullerene covalently bonded by [4+2] cycloaddition to at least one derivative moiety.

Another embodiment provides a photovoltaic device comprising at least one anode, at least one cathode, and at least one active layer, wherein the active layer comprises a composition comprising a mixture comprising: (i) at least one p-type material, (ii) at least one n-type material, wherein the n-type material comprises a fullerene derivative represented by:

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.

Another embodiment comprises a method of making a composition comprising a mixture comprising: (i) providing at least one p-type material, (ii) providing at least one n-type material, wherein the n-type material comprises a fullerene derivative represented by:

and solvates, salts, and mixtures thereof,
wherein n is at least one,
F* comprises a fullerene having a surface which comprises six-membered and five-membered rings; and
R comprises at least one optionally substituted, unsaturated or saturated, carbocyclic or heterocyclic first ring, wherein the first ring directly bonds to the fullerene.
(iii) combining the p-type and n-type materials to form the mixture, wherein the mixture further comprises at least one solvent.

Advantages include substantially better photovoltaic efficiency, versatility with a variety of active layer systems which can be tuned to particular applications, improved device lifetime, and improved material and device processability.

DETAILED DESCRIPTION

Introduction & Definitions

Figure 1:
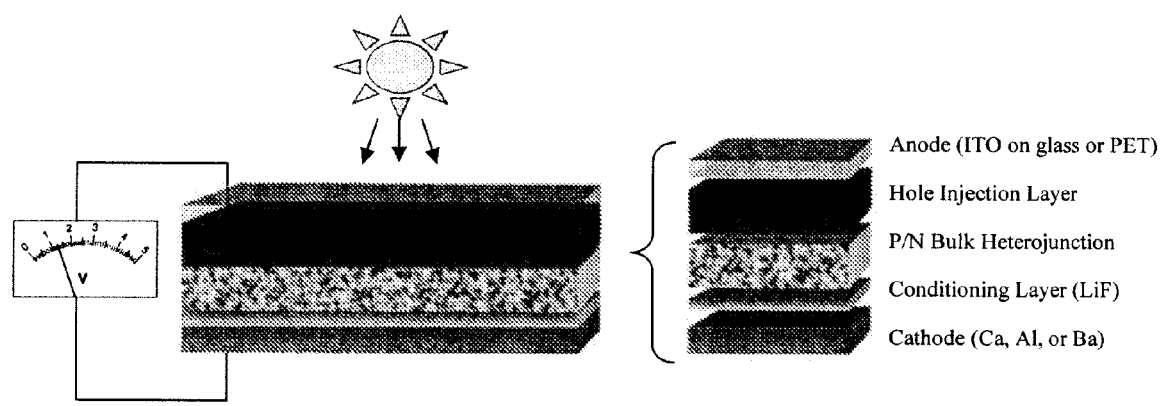
FIG. 1 shows a typical conductive polymer photovoltaic (solar cell).

"Optionally substituted" groups refers to functional groups that may be substituted or unsubstituted by additional functional groups. When a group is unsubstituted by an additional group is may be referred to as a group name, for example alkyl or aryl. When a group is substituted with additional functional groups it may more generically be referred to as substituted alkyl or substituted aryl.

"Carbocyclic" refers to a cyclic arrangement of carbon atoms forming a ring including for example benzene or cyclohexane. Carbocyclic includes both cycloalkyl and aryl groups. The term "cycloalkyl" refers to cyclic alkyl groups of from 3 to 20 carbon atoms having single or multiple condensed cyclic rings which condensed rings may or may not be aromatic provided that the point of attachment is not at an aromatic carbon atom. "Aryl" refers to an aromatic carbocyclic group of from 6 to 20 carbon atoms having a single ring (e.g., phenyl) or multiple condensed rings (e.g., naphthyl or anthryl) which condensed rings may or may not be aromatic provided that the point of attachment is at an aromatic carbon atom. Preferred aryls include phenyl, naphthyl, and the like.

"Heterocyclic" refers to a saturated, unsaturated, or heteroaromatic group having a single ring or multiple condensed rings, from 1 to 20 carbon atoms and from 1 to 4 heteroatoms, selected from nitrogen, oxygen, sulfur, —S(O)— and —S(O)$_2$— within the ring. Such heterocyclic groups can have a single ring (e.g., pyridyl or furyl) or multiple condensed rings (e.g., indolizinyl or benzothienyl) wherein the condensed rings may or may not be aromatic and/or contain a heteroatom provided that the point of attachment is through an atom of the aromatic heteroaryl group. Heterocyclic groups can be for example, pyridine, or thiophene, or furan or tetrahydrofuran, pyrrole, tetrahydropyrrole, pyran, and the like. The term heterocyclic includes heteroaryl groups where "heteroaryl" refers to an aromatic group of from 1 to 20 carbon atoms and 1 to 4 heteroatoms selected from the group consisting of oxygen, nitrogen, sulfur, —S(O)—, and —S(O)$_2$— within the ring. Heteroaryls include pyridyl, pyrrolyl, indolyl, thiophenyl, and furyl.

"Alkyl" refers to straight chain and branched alkyl groups having from 1 to 20 carbon atoms, or from 1 to 15 carbon atoms, or from 1 to 10, or from 1 to 5, or from 1 to 3 carbon atoms. This term is exemplified by groups such as methyl, ethyl, n-propyl, iso-propyl, n-butyl, t-butyl, n-pentyl, ethylhexyl, dodecyl, isopentyl, and the like.

"Substituted alkyl" refers to an alkyl group having from 1 to 3, and preferably 1 to 2, substituents selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

The terms "Substituted carbocyclic," "substituted aryl," "substituted cycloalkyl," "substituted heterocyclic," and "substituted heteroaryl refer to carbocyclic, aryl, cycloalkyl, heterocyclic, or heteroaryl groups with from 1 to 5 substituents, or optionally from 1 to 3 substituents, or optionally from 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Alkoxy" refers to the group "alkyl-O—" which includes, by way of example, methoxy, ethoxy, n-propyloxy, iso-propyloxy, n-butyloxy, t-butyloxy, n-pentyloxy, 1-ethylhex-1-yloxy, dodecyloxy, isopentyloxy, and the like.

"Substituted alkoxy" refers to the group "substituted alkyl-O—."

"Alkenyl" refers to alkenyl group preferably having from 2 to 6 carbon atoms and more preferably 2 to 4 carbon atoms and having at least 1 and preferably from 1-2 sites of alkenyl unsaturation. Such groups are exemplified by vinyl, allyl, but-3-en-1-yl, and the like.

"Substituted alkenyl" refers to alkenyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic with the proviso that any hydroxyl substitution is not attached to a vinyl (unsaturated) carbon atom.

"Aryloxy" refers to the group aryl-O— that includes, by way of example, phenoxy, naphthoxy, and the like.

"Alkoxy" refers to the group "alkyl-O—" which includes, by way of example, methoxy, ethoxy, n-propoxy, iso-propoxy, n-butoxy, t-butoxy, sec-butoxy, n-pentoxy and the like.

"Substituted alkoxy" refers to the group "substituted alkyl-O—".

"Acyl" refers to the groups H—C(O)—, alkyl-C(O)—, substituted alkyl-C(O)—, alkenyl-C(O)—, substituted alkenyl-C(O)—, alkynyl-C(O)—, substituted alkynyl-C(O)— cycloalkyl-C(O)—, substituted cycloalkyl-C(O)—, aryl-C(O)—, substituted aryl-C(O)—, heteroaryl-C(O)—, substituted heteroaryl-C(O), heterocyclic-C(O)—, and substituted heterocyclic-C(O)— wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Acylamino" refers to the group —C(O)NRR where each R is independently selected from the group consisting of hydrogen, alkyl, substituted alkyl, alkenyl, substituted alkenyl, alkynyl, substituted alkynyl, aryl, substituted aryl, cycloalkyl, substituted cycloalkyl, heteroaryl, substituted heteroaryl, heterocyclic, substituted heterocyclic and where each R is joined to form together with the nitrogen atom a heterocyclic or substituted heterocyclic ring wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Acyloxy" refers to the groups alkyl-C(O)O—, substituted alkyl-C(O)O—, alkenyl-C(O)O—, substituted alkenyl-C(O)O—, alkynyl-C(O)O—, substituted alkynyl-C(O)O—, aryl-C(O)O—, substituted aryl-C(O)O—, cycloalkyl-C(O)O—, substituted cycloalkyl-C(O)O—, heteroaryl-C(O)O—, substituted heteroaryl-C(O)O—, heterocyclic-C(O)O—, and substituted heterocyclic-C(O)O— wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Alkynyl" refers to alkynyl group preferably having from 2 to 6 carbon atoms and more preferably 2 to 3 carbon atoms and having at least 1 and preferably from 1-2 sites of alkynyl unsaturation.

"Substituted alkynyl" refers to alkynyl groups having from 1 to 3 substituents, and preferably 1 to 2 substituents, selected from the group consisting of alkoxy, substituted alkoxy, acyl, acylamino, acyloxy, amino, substituted amino, aminoacyl, aryl, substituted aryl, aryloxy, substituted aryloxy, cyano, halogen, hydroxyl, nitro, carboxyl, carboxyl esters, cycloalkyl, substituted cycloalkyl, heteroaryl, substituted heteroaryl, heterocyclic, and substituted heterocyclic.

"Amino" refers to the group —NH$_2$.

"Substituted amino" refers to the group —NR'R" where R' and R" are independently selected from the group consisting of hydrogen, alkyl, substituted alkyl, alkenyl, substituted alkenyl, alkynyl, substituted alkynyl, aryl, substituted aryl, cycloalkyl, substituted cycloalkyl, heteroaryl, substituted heteroaryl, heterocyclic, substituted heterocyclic and where R' and R" are joined, together with the nitrogen bound thereto to form a heterocyclic or substituted heterocyclic group provided that R' and R" are both not hydrogen. When R' is hydrogen and R" is alkyl, the substituted amino group is sometimes referred to herein as alkylamino. When R' and R" are alkyl, the substituted amino group is sometimes referred to herein as dialkylamino.

"Aminoacyl" refers to the groups —NRC(O)alkyl, —NRC(O)substituted alkyl, —NRC(O)cycloalkyl, —NRC(O)substituted cycloalkyl, —NRC(O)alkenyl, —NRC(O)substituted alkenyl, —NRC(O)alkynyl, —NRC(O)substituted alkynyl, —NRC(O)aryl, —NRC(O)substituted aryl, —NRC(O)heteroaryl, —NRC(O)substituted heteroaryl, —NRC(O)heterocyclic, and —NRC(O)substituted heterocyclic where R is hydrogen or alkyl and wherein alkyl, substituted alkyl, alkenyl, substituted alkenyl, alkynyl, substituted alkynyl, cycloalkyl, substituted cycloalkyl, aryl, substituted aryl, heteroaryl, substituted heteroaryl, heterocyclic and substituted heterocyclic are as defined herein.

"Carboxyl" refers to —COOH or salts thereof.

"Carboxyl esters" refers to the groups —C(O)O-alkyl, —C(O)O-substituted alkyl, —C(O)Oaryl, and —C(O)O-substituted aryl wherein alkyl, substituted alkyl, aryl and substituted aryl are as defined herein.

"Cycloalkoxy" refers to —O-cycloalkyl groups.

"Substituted cycloalkoxy" refers to —O-substituted cycloalkyl groups.

"Halo" or "halogen" refers to fluoro, chloro, bromo and iodo.

"Heteroaryloxy" refers to the group —O-heteroaryl and "substituted heteroaryloxy" refers to the group —O-substituted heteroaryl.

"Heterocyclyloxy" refers to the group —O-heterocyclic and "substituted heterocyclyloxy" refers to the group —O-substituted heterocyclic.

"Thiol" refers to the group —SH.

"Thioalkyl" or "alkylthioether" or "thioalkoxy" refers to the group —S-alkyl.

"Substituted thioalkyl" or "substituted alkylthioether" or "substituted thioalkoxy" refers to the group —S-substituted alkyl.

"Thiocycloalkyl" refers to the groups —S-cycloalkyl and "substituted thiocycloalkyl" refers to the group —S-substituted cycloalkyl.

"Thioaryl" refers to the group —S-aryl and "substituted thioaryl" refers to the group —S-substituted aryl.

"Thioheteroaryl" refers to the group —S-heteroaryl and "substituted thioheteroaryl" refers to the group —S-substituted heteroaryl.

"Thioheterocyclic" refers to the group —S-heterocyclic and "substituted thioheterocyclic" refers to the group —S-substituted heterocyclic.

"Salts" are derived from a variety of organic and inorganic counter ions well known in the art and include, by way of example only, sodium, potassium, calcium, magnesium, ammonium, tetraalkylammonium, and the like; and when the molecule contains a basic functionality, salts of organic or inorganic acids, such as hydrochloride, hydrobromide, tartrate, mesylate, acetate, maleate, oxalate and the like.

"Solvate" refers to those forms of the compounds which form, in the solid or liquid state, a complex by coordination with solvent-molecules. Hydrates are a specific form of solvates in which the coordination takes place with water.

"Conjugated polymer" refers to polymers comprising at least some conjugated unsaturation in the backbone.

"A polythiophene" or "polythiophene" refers to polymers comprising a thiophene in the backbone including polythiophene, derivatives thereof, and copolymers and terpolymers thereof.

"Regioregular polythiophene" refers to polythiophene having high levels of regioregularity including for example at least 80%, or at least 90%, or at least 95%, or at least 98%, or at least 99%.

It is understood that in all substituted groups defined above, polymers arrived at by defining substituents with further substituents to themselves (e.g., substituted aryl having a substituted aryl group as a substituent which is itself substituted with a substituted aryl group, etc.) are not intended for inclusion herein. In such cases, the maximum number of such substituents is three. That is to say that each of the above definitions is constrained by a limitation that, for example, substituted aryl groups are limited to -substituted aryl-(substituted aryl)-substituted aryl.

Similarly, it is understood that the above definitions are not intended to include impermissible substitution patterns (e.g., methyl substituted with 5 fluoro groups or a hydroxyl group alpha to ethenylic or acetylenic unsaturation). Such impermissible substitution patterns are well known to the skilled artisan.

Other terms used herein are defined as follows, unless the context makes clear otherwise.

All references cited herein are incorporated by reference in their entirety.

Solar cells are described in for example Hoppe and Sariciftci, *J. Mater. Res.*, Vol. 19, No. 7, Jul. 2004, 1924-1945, which is hereby incorporated by reference including the figures.

FIG. 1 illustrates some components of a conventional solar cell. See also for example Dennler et al., "Flexible Conjugated Polymer-Based Plastic Solar Cells: From Basics to Applications," Proceedings of the IEEE, vol. 93, no. 8, Aug. 2005, 1429-1439, including FIGS. 4 and 5. Various architectures for the solar cell can be used, including inverted solar cells. Important elements include the active layer, an anode, a cathode, and a substrate to support the larger structure. In addition, a hole injection layer can be used, and one or more conditioning layers can be used. The active layer can comprise a P/N composite including a P/N bulk heterojunction.

The following references describe photovoltaic materials and devices:

US Patent Publication 2006/0076050 to Williams et al., "Heteroatomic Regioregular Poly(3-Substitutedthiophenes) for Photovoltaic Cells," (Plextronics) which is hereby incorporated by reference including working examples and drawings.

US Patent Publication 2006/0237695 (Plextronics), "Copolymers of Soluble Poly(thiophenes) with Improved Electronic Performance," which is hereby incorporated by reference including working examples and drawings.

U.S. Pat. No. 7,147,936 to Louwet et al.

In addition, US Patent Publication 2006/0175582 "Hole Injection/Transport Layer Compositions and Devices" describes hole injection layer technology, (Plextronics) which is hereby incorporated by reference including working examples and drawings.

Device Elements Other than the Active Layer

Electrodes, including anodes and cathodes, are known in the art for photovoltaic devices. See, for example, Hoppe et al. article cited above. Known electrode materials can be used. Transparent conductive oxides can be used. Transparency can be adapted for a particular application. For example, the anode can be indium tin oxide, including ITO supported on a substrate. Substrates can be rigid or flexible.

If desired, hole injection and hole transport layers can be used. An HIL layer can be for example PEDOT:PSS as known in the art. See, for example, Hoppe et al. article cited above.

Active Layer P-Type Material

The active layer can comprise at least one p-type material, and the fullerene derivative n-type materials can be used in combination with various p-type materials. The advantage of some embodiments of the invention is that the substituents used to derivatize the fullerene can be chosen based on the calculated LUMO level or the calculated electron affinity.

The goal in these embodiments can be to maximize the difference between the LUMO level of the n-type with the HOMO level of the p-type, while still maintaining photo carrier generation within the active layer.

The p-type material can be an organic material including a polymeric material, although other types of p-type material are known in the art. For example, the p-type material can comprise a conjugated polymer or a conducting polymer, comprising a polymer backbone having a series of conjugated double bonds. It can be a homopolymer or a copolymer including a block copolymer or a random copolymer, or a terpolymer. Examples include polythiophene, polypyrrole, polyaniline, polyfluorene, polyphenylene, polyphenylene vinylene, and derivatives, copolymers, and mixtures thereof. The p-type material can comprise a conjugated polymer soluble or dispersible in organic solvent or water. Conjugated polymers are described in for example T. A. Skotheim, *Handbook of Conducting Polymers*, 3$^{rd}$ Ed. (two vol), 2007; Meijer et al., *Materials Science and Engineering*, 32 (2001), 1-40; and Kim, *Pure Appl. Chem.*, 74, 11, 2031-2044, 2002. The p-type active material can comprise a member of a family of similar polymers which have a common polymer backbone but are different in the derivatized side groups to tailor the properties of the polymer. For example, a polythiophene can be derivatized with alkyl side groups including methyl, ethyl, hexyl, dodecyl, and the like.

One embodiment comprises copolymers and block copolymers which comprise, for example, a combination of conjugated and non-conjugated polymer segments, or a combination of a first type of conjugated segment and a second type of conjugated segment. For example, these can be represented by AB or ABA or BAB systems wherein, for example, one block such as A is a conjugated block and another block such as B is an non-conjugated block or an insulating block. Or alternately, each block A and B can be conjugated. The non-conjugated or insulating block can be for example an organic polymer block, an inorganic polymer block, or a hybrid organic-inorganic polymer block including for example addition polymer block or condensation polymer block including for example thermoplastic types of polymers, polyolefins, polysilanes, polyesters, PET, and the like. Block copolymers are described in, for example, U.S. Pat. No. 6,602,974 to McCullough et al., and US Patent Publication No. 2006/0278867 to McCullough et al. published Dec. 14, 2006, each incorporated herein by reference in its entirety.

In particular, polythiophenes and derivatives thereof are known in the art. They can be homopolymers or copolymers, including block copolymers. They can be soluble or dispersible. They can be regioregular. In particular, optionally substituted-alkoxy- and optionally substituted alkyl-substituted polythiophenes can be used. In particular, regioregular polythiophenes can be used as described in for example U.S. Pat. Nos. 6,602,974 and 6,166,172 to McCullough et al., as well as McCullough, R. D.; Tristram-Nagle, S.; Williams, S. P.; Lowe, R. D.; Jayaraman, M. J. Am. Chem. Soc. 1993, 115, 4910, including homopolymers and block copolymers. See also Plextronics (Pittsburgh, Pa.) commercial products. Soluble alkyl- and alkoxy-substituted polymers and copolymers can be used including poly(3-hexylthiophene). Other examples can be found in U.S. Pat. Nos. 5,294,372 and 5,401,537 to Kochem et al. U.S. Pat. Nos. 6,454,880 and 5,331,183 further describe active layers.

Soluble materials or well dispersed materials can be used in the stack to facilitate processing.

Additional examples of p-type materials and polythiophenes can be found in WO 2007/011739 (Gaudiana et al.) which describes polymers having monomers which are, for example, substituted cyclopentadithiophene moieties, and which is hereby incorporated by reference in its entirety including formulas.

Active Layer N-Type Material

The active layer can comprise an n-type material comprising at least one fullerene structure. Fullerenes are known in the art. Fullerenes can be described as spheroidal carbon compounds. For example, the fullerene surface can present [6,6] bonding and [6,5] bonding as known in the art. The fullerene can have a surface comprising six-membered and five-membered rings. Fullerenes can be for example C60, C70, or C84, and additional carbon atoms can be added via derivative groups. See for example Hirsch, A.; Brettreich, M., *Fullerenes: Chemistry and Reactions*, Wiley-VCH Verlag, Weinheim, 2005, which is hereby incorporated by reference including teachings for fullerene nomenclature and synthesis, derivatization, reduction reactions (Chapter 2), nucleophilic additions (Chapter 3), cycloadditions (Chapter 4), hydrogenation (Chapter 5), radical additions (Chapter 6), transition metal complex formation (Chapter 7), oxidation and reactions with electrophiles (Chapter 8), halogenation (Chapter 9), regiochemistry (Chapter 10), cluster modification (Chapter 11), heterofullerenes (Chapter 12), and higher fullerenes (Chapter 13). Methods described herein can be used to synthesize fullerene derivatives and adducts.

In particular, the active layer can comprise at least one n-type material, wherein the n-type material comprises at least one derivatized fullerene or fullerene derivative. The derivative compound can be for example an adduct. The terms "derivatized fullerene," "fullerene derivative" as used herein, can be used interchangeably and can be for example fullerenes comprising, from 1 to 84, or 1 to 70, or 1 to 60, from 1 to 20, from 1 to 18, from one to ten, or from one to six, or from one to five, or from one to three substituents each covalently bonded to, for example, one or two carbons in the spheroidal carbon compounds. The derivatized fullerene can comprise a fullerene covalently bonded by [4+2] cycloaddition to at least one derivative moiety, R.

Structures for the n-type material can be represented by:

$$F^*—(R)_n$$

and solvates, salts, and mixtures thereof,
wherein
n is at least one;
F is a spheroidal fullerene having a surface which comprises six-membered and five-membered rings; and
R comprises at least one optionally substituted, unsaturated or saturated, carbocyclic or heterocyclic first ring, wherein the first ring directly bonds to the fullerene.

Formula (I) represents an embodiment wherein C60 is bonded to n R groups, and the bonding is generically represented.

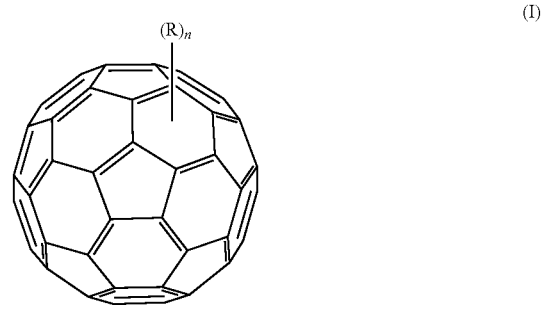

(I)

The first ring can be substituted. The first ring can be not substituted. The first ring can be an unsaturated ring. The first ring can be a saturated ring. The first ring can be a carbocyclic ring. The first ring can be a heterocyclic ring.

The first ring can be an optionally substituted four-membered, five-membered, or six-membered ring. It can in particular be an optionally substituted five-membered ring.

The R group can further comprise a second ring which is bonded to or fused with the first ring. The second ring can be optionally substituted. The second ring can be for example an aryl group which is fused to the first ring.

The first ring directly bonds to the fullerene. For example, the R group can covalently bond to the fullerene by a [4+2] cycloaddition. The R group can be covalently bonded to the fullerene by one or two covalent bonds, including two covalent bonds, including by two carbon-carbon bonds. The R group can be bonded to the fullerene surface by a covalent bond to one atom in the R group. Alternatively the R group can be bonded to the fullerene surface by covalent bonds to two atoms in the R group. The two atoms in the R group bonded to the fullerene can be adjacent to each other, or can be separated by from each other by 1 to 3 other atoms in the R group. The R group can be covalently bonded to the fullerene by two carbon-carbon bonds at a fullerene [6,6] position.

The fullerene can comprise only carbon. The fullerene can comprise at least one derivative group bonded to the fullerene besides R.

For example, fullerenes can be derivatized with electron withdrawing groups or electron releasing groups. Electron withdrawing groups and electron releasing groups are known in the art and can be found in *Advanced Organic Chemistry*, 5th Ed, by Smith, March, 2001.

The electron withdrawing group can be attached directly to the fullerene cage or via methano-bridges similar to the PCBM structure.

The electron donating group can be attached directly to the fullerene cage or via methano-bridges similar to the PCBM structure.

Fullerenes can be derivatized to improve their absorption in the visible range, relative to C60-PCBM. Improved absorption in the visible range may increase or improve the photocurrent of a photovoltaic device comprising the derivatized fullerene.

In one embodiment, F* is selected from C60, C70 and C84, and combinations thereof.

In one embodiment, R is selected from optionally substituted aryl and optionally substituted heteroaryl.

In one embodiment, R is selected from optionally substituted indene, optionally substituted naphthyl, optionally substituted phenyl, optionally substituted pyridinyl, optionally substituted quinolinyl, optionally substituted cyclohexyl, and optionally substituted cyclopentyl.

In one embodiment R is selected from indene, naphthyl, phenyl, pyridinyl, quinolinyl, cyclohexyl and cyclopentyl.

The value n can be an integer. In one embodiment, n can be from 1 to 84, or from 1 to 70, or from 1 to 60, or from 1 to 30, or from 1 to 10. In one embodiment n is from 1 to 6. In one embodiment n is from 1 to 3.

In one embodiment n is 1. In one embodiment n is 2. In one embodiment n is 3.

In one embodiment, the first ring is optionally substituted with at least one substituent selected from the group consisting of hydroxy, acyl, acylamino, acyloxy, alkyl, substituted alkyl, alkoxy, substituted alkoxy, alkenyl, substituted alkenyl, alkynyl, substituted alkynyl, amino, substituted amino, aminoacyl, aryl, substituted aryl, aryloxy, substituted aryloxy, cycloalkoxy, substituted cycloalkoxy, carboxyl, carboxyl esters, cyano, thiol, thioalkyl, substituted thioalkyl, thioaryl, substituted thioaryl, thioheteroaryl, substituted thioheteroaryl, thiocycloalkyl, substituted thiocycloalkyl, thioheterocyclic, substituted thioheterocyclic, cycloalkyl, substituted cycloalkyl, halo, nitro, heteroaryl, substituted heteroaryl, heterocyclic, substituted heterocyclic, heteroaryloxy, substituted heteroaryloxy, heterocyclyloxy, or substituted heterocyclyloxy, or combination thereof.

In one embodiment n is 1 and R is indene. In one embodiment n is 2 and R is indene. In one embodiment n is 3 and R is indene. In one embodiment n is 4 and R is indene. In one embodiment n is 5 and R is indene. In one embodiment n is 6 and R is indene.

In one embodiment, R can be covalently bonded to the fullerene by [4+2] cycloaddition, alternatively called a [4+2] cycloadduct. Reactions including [4+2] cycloaddition reactions and Diels-Alder reactions are generally known in the art. A dienophile double bond can react with a diene to produce a six membered ring. See for example *Advanced Organic Chemistry, Reactions, Mechanisms, and Structure*, $2^{nd}$ Ed., J. March, 1977, including chapters on addition to carbon-carbon multiple bonds (e.g., Chapter 15). See also, Belik et al., *Angew. Chem. Int. Ed. Engl.* 1993, 32, 1, 78-80 (showing reaction of C60 with a C8 o-quinodimethane compound to form a C68 compound comprising the fullerene and the derivative moiety); and Puplovskis et al., *Tetrahedron Letters*, 38, 2, 285-288, 1997, 285-288 (showing reaction of C60 with C9 indene to form a C69 compound comprising the fullerene and the derivative moiety). The cycloaddition reaction can result in reaction at the [6,6] fullerene double bonds rather than [6,5] double bonds. Cycloaddition reactions are described in detail in Chapter 4, pages 101-183, of the Hirsch, Brettreich text, *Fullerenes, Chemistry and Reactions*, 2005.

One example of a fullerene derivative is an indene derivative. In addition, indene itself can be derivatized. Fullerene can be derivatized by methods described in for example Belik et al., Angew. Chem. Int. Ed. Engl., 1993, 32, No. 1, pages 78-80, which is hereby incorporated by reference. This paper describes addition to electron poor superalkene, C60, which can add radicals such as o-quinodimethane. It can be prepared in situ containing different functional groups and form very reactive dienes that can form [4+2] cycloadducts even with the least reactive dienophiles. This method provides good selectivity and stability.

The fullerene can comprise at least two derivative moieties, R, to form bis-adducts or at least three derivative moieties, R, to form tris-adducts. These substituents can be added to the fullerene by [4+2] cycloaddition. For example, Belik et al. show in Scheme 1, formula 3, a fullerene compound comprising two derivative moieties. In addition, two fullerenes can be covalently linked by one derivative moiety as shown in Scheme 2 of Belik et al.

While the various embodiments are not limited by theory, it is believed that the derivatization may disrupt the conjugation of the fullerene cage. Disrupting the conjugation effects the ionization potential and electron affinity of the derivatized fullerene.

In one embodiment, the active layer can comprise at least one polythiophene and at least one fullerene derivative comprising an electron withdrawing group.

Device Fabrication

Devices using the presently claimed inventions can be made using for example ITO as an anode material on a substrate. Other anode materials can include for example metals, such as Au, carbon nanotubes, single or multiwalled, and other transparent conducting oxides. The resistivity of the anode can be maintained below for example 15 Ω/sq or less, 25 or less, 50 or less, or 100 or less, or 200 or less, or 250 or less. The substrate can be for example glass, plastics (PTFE, polysiloxanes, thermoplastics, PET, PEN and the like), metals (Al, Au, Ag), metal foils, metal oxides, (TiOx, ZnOx) and semiconductors, such as Si. The ITO on the substrate can be cleaned using techniques known in the art prior to device layer deposition. An optional hole injection layer (HIL) can be added using for example spin casting, ink jetting, doctor blading, spray casting, dip coating, vapor depositing, or any other known deposition method. The HIL can be for example PEDOT, PEDOT/PSS or TBD, or NPB, or Plexcore HIL (Plextronics, Pittsburgh, Pa.).

The thickness of the HIL layer can be for example from about 10 nm to about 300 nm thick, or from 30 nm to 60 nm, 60 nm to 100 nm, or 100 nm to 200 nm. The film then can be optionally dried/annealed at 110 to 200° C. for 1 min to an hour, optionally in an inert atmosphere.

The active layer can be formulated from a mixture of n-type and p-type materials. The n- and p-type materials can be mixed in a ratio of for example from about 0.1 to 4.0 (p-type) to about 1 (n-type) based on a weight, or from about 1.1 to about 3.0 (p-type) to about 1 (n-type) or from about 1.1 to about 1.5 (p-type) to about 1 (n-type). The amount of each type of material or the ratio between the two types of components can be varied for the particular application.

The n- and p-type materials can be mixed in a solvent or in a solvent blend at for example from about 0.01 to about 0.1% volume solids. The solvents useful for the presently claimed inventions can include, for example, halogenated benzenes, alkyl benzenes, halogenated methane, and thiophenes derivatives, and the like. More specifically, solvent can be for example cholobenzene, dichlorobenzene, xylenes, toluene, chloroform, 3-methylthiophene, 3-propylthiephene, 3-hexylthiephene, and mixtures thereof. At least two solvents can be used.

Particularly useful solvent systems can be used as described in co-pending US patent application entitled "Solvent System for Conjugated Polymers," Ser. No. 60/915,632 filed on May 2, 2007, to Sheina et al., which is hereby incorporated by reference in its entirety.

The active layer can be then deposited by spin casting, ink jetting, doctor blading, spray casting, dip coating, vapor depositing, or any other known deposition method, on top of the HIL film. The film is then optionally annealed at for example about 40 to about 250° C., or from about 150 to 180° C., for about 10 min to an hour in an inert atmosphere.

Next, a cathode layer can be added to the device, generally using for example thermal evaporation of one or more metals. For example, a 1 to 15 nm Ca layer is thermally evaporated onto the active layer through a shadow mask, followed by deposition of a 10 to 300 nm Al layer.

In some embodiments and optional interlayer may be included between the active layer and the cathode, and/or between the HTL and the active layer. This interlayer can be for example from 0.5 nm to about 100 nm, or from about 1 to 3 nm, thick. The interlayer can comprise an electron conditioning, a hole blocking, or an extraction material such as LiF, BCP, bathocuprine, fullerenes or fullerene derivatives, such as C60 and other fullerenes and fullerene derivatives discussed herein.

The devices can be then encapsulated using a glass cover slip sealed with a curable glue, or in other epoxy or plastic coatings. Cavity glass with a getter/dessicant may also be used.

In addition, the active layer can comprise additional ingredients including for example surfactants, dispersants, and oxygen and water scavengers.

The active layer can comprise multiple layers or be multi-layered.

The active layer composition can comprise a mixture in the form of a film.

Active Layer Morphology

The active layer can be a p-n composite and for example can form a heterojunction including a bulk heterojunction. See for example discussion of nanoscale phase separation in bulk heterojunctions in Dennler et al., "Flexible Conjugated Polymer-Based Plastic Solar Cells: From Basics to Applications," Proceedings of the IEEE, vol. 93, no. 8, Aug. 2005, 1429-1439. Conditions and materials can be selected to provide for good film formation, low roughness (e.g., 1 nm RMS), and discrete, observable, phase separation characteristics can be achieved. The present invention can have phase separated domains on a scale of a about 5 to 50 nm as measured by AFM. AFM analysis can be used to measure surface roughness and phase behavior. In general, phase separated domains are not desirable so that both donor and acceptor are uniformly and continuously distributed in the active layer.

Device Performance

Known solar cell parameters can be measured including for example $J_{SC}$ (mA/cm$^2$) and Voc (V) and fill factor (FF) and power conversion efficiency (%, PCE) by methods known in the art. See for example Hoppe article cited above and references cited therein.

For example, the efficiency can be at least about 2%, or at least about 3%, or at least about 3.5%, or at least about 4%, or at least about 4.5%, or at least about 5.0%, or at least about 5.5%, or at least about 6.0%, or at least about 7.0%, or at least about 8.0%, or at least about 9.0%, or at least about 10.0% at 1 sun (AM1.5G, 100 mW/cm$^2$). An efficiency range can be for example about 2% to about 15%, or about 2% to about 10%, or about 2% to about 7%. These efficiencies can be verified by NREL.

The fill factor, for example, can be at least about 0.60, or at least about 0.63, or at least about 0.67, at least about 0.7, at least about 0.75, or at least about 0.8, at least about 0.85.

The Voc (V), for example, can be at least about 0.56, or at least about 0.63, or at least about 0.82, at least about 0.9, at least about 1.0, at least about 1.2, at least about 1.4, at least about 1.5.

The Jsc (mA/cm$^2$), for example, can be at least about 8.92, or at least about 9.20, or at least about 9.48, or at least about 10, or at least about 11, or at least about 12, or at least about 13, or at least about 14, or at least about 15.

The device can demonstrate an increase of efficiency of at least 5%, or at least 15%, compared to a substantially analogous device comprising an active layer of P3HT-PCBM.

Figure 2:
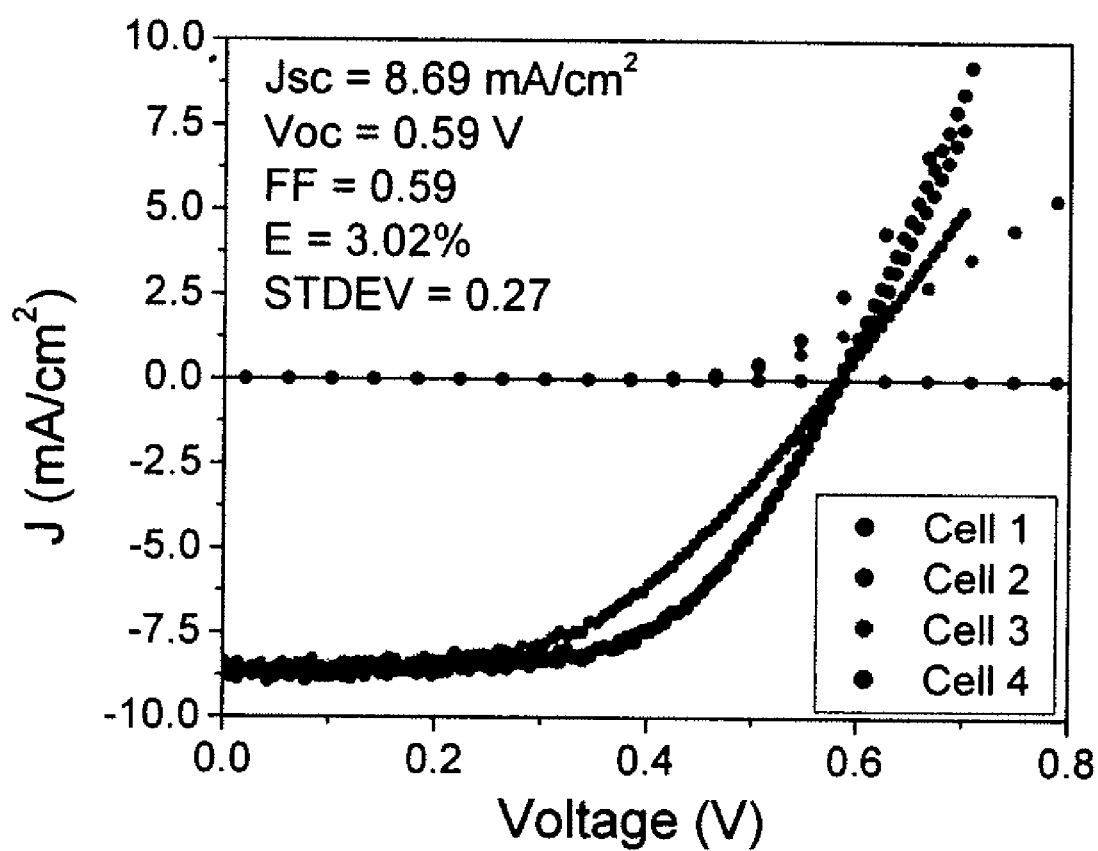
FIG. 2 shows improved performance with C70PCBM versus C60PCBM.
Figure 3:
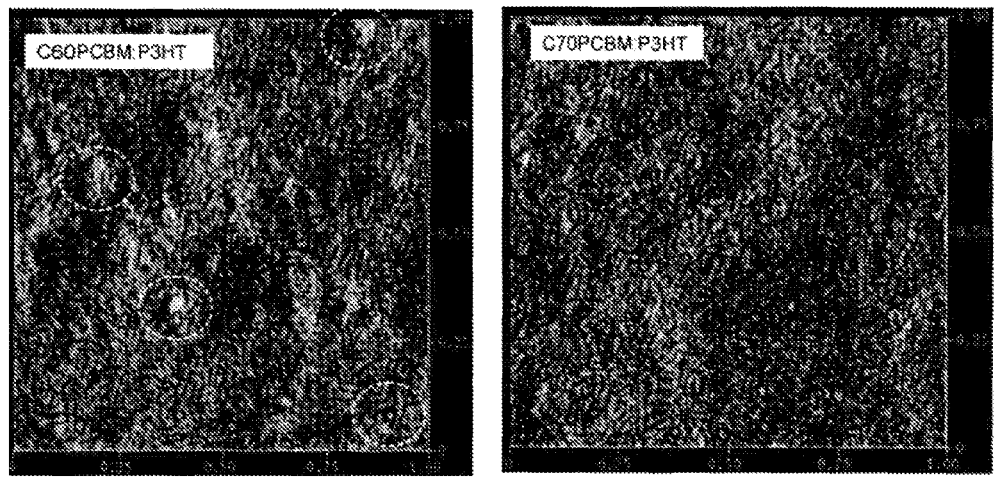
FIG. 3 provides AFM images for C60PCBM:P3HT versus C70PCBM:P3HT prepared in dichlorobenzene. Circles denote phase separation in C60PCBM system—these domains are absent in C70PCBM active layer.

FIG. 2 illustrates improved performance, wherein efficiency is raised to 3% rather than 2% for control devices (at least 20% improvement). The improvement in efficiency is consistent with the significant extension to higher wavelengths of the absorption spectrum for C70PCBM and the resulting blend with p-type material compared to that of C60PCBM-based films. Additional comparative data are provided in FIG. 3 showing better film morphology.

Oriel Solar Simulators can be used to determine PV properties including for example FF, Jsc, Voc, and efficiencies. The simulator can be calibrated by methods known in the art including for example calibration with a KG5-Si reference cell.

LITERATURE

The following references can be also used as needed to practice the various embodiments described herein and are incorporated herein by reference:

References Cited

Anvar, et al., High Efficiency P3HT/PCBM Solar *Cell Mater. Res. Symp. Proc.,* 2005, 836, 69-80

Birkett, P. R.; Avent, A. G.; Darwish, A. D.; Kroto, H. W.; Taylor, R.; Walton, D. R. M. Preparation and $^{13}$C NMR Spectroscopic Characterization of $C_{60}Cl_6$. *J. Chem. Soc., Chem. Commun.* 1993, 1230-1232. Carroll, et al., *App. Phys. Let.,* 2005, 87, 083506; *Organic Letters,* 2005, 7, 574

Cioslowski, J.; Rao, N.; Moncrieff, D. Standard Enthalpies of Formation of Fullerenes and Their Dependence on Structural Motifs. *J. Am. Chem. Soc.* 2000, 122, 8265-8270.

Diener, M. D., Nichelson, N. and Alford, J. M. Synthesis of Single-Walled Carbon Nanotubes in Flames. *J. Phys. Chem. B* 2000, 104, 9615-9620.

Dresselhaus, M. S., Dresselhaus, G. and Eklund, P. C., Science of Fullerenes and Carbon Nanotubes. Academic Press, 1996, pp. 870-917.

Height, M. J.; Howard, J. B.; Vander Sande, J. B. Method and Apparatus for Synthesizing Filamentary Structures. patent application Ser. No. 10/389,002 (U.S. Serial No.), 2003.

Height, M. J., Howard, J. B., Tester, J. W., and Vander Sande, J. B. Flame Synthesis of Single-Walled Carbon Nanotubes. *Carbon* 42 (2004) 2295-2307.

Height, M. J., Howard, J. B., and Tester, J. W., Flame Synthesis of Single-walled Carbon Nanotubes. *Proc. Combust. Inst.* 2005, 30, 2537-2543.

Hirsch, A.; Brettreich, M. Fullerenes: Chemistry and Reactions. Wiley-VCH Verlag, Weinheim, 2005.

Howard, J. B.; McKinnon, J. T.; Makarovsky, Y.; Lafleur, A. L.; Johnson, M. E. Fullerenes $C_{60}$ and $C_{70}$ in Flames. *Nature* 1991, 352, 139-141.

Howard, J. B.; McKinnon, J. T.; Johnson, M. E.; Makarovsky, Y.; Lafleur, A. L. Production of $C_{60}$ and $C_{70}$ fullerenes in benzene-oxygen flames. *J. Phys. Chem.* 1992a, 96, 6657-6662.

Howard, J. B.; Lafleur, A. L.; Makarovsky, Y.; Mitra, S.; Pope, C. J.; Yadav, T. K. Fullerenes Synthesis in Combustion. *Carbon* 1992b, 30, 1183-1201.

Howard, J. B. Fullerenes Formation in Flames. *Proc. Combust. Inst.* 1992, 24, 933-946.

Howard, J. B.; McKinnon, J. T. Combustion method for producing fullerenes. U.S. Pat. No. 5,273,729 (1993).

Howard, J. B., Chowdhury, K. D. and Vander Sande, J. B., Carbon Shells in Flames. *Nature* 1994, 370, 603.

Howard, J. B.; Vander Sande, J. B.; Chowdhury, K. Das Production of fullerenic nanostructures in flames. U.S. Pat. No. 5,985,232 (1999).

Howard, J. B.; Vander Sande, J. B.; Chowdhury, K. Das Production of fullerenic soot in flames. U.S. Pat. No. 6,162, 411 (2000).

Howard, J. B.; Kronholm, D. F.; Modestino, A. J.; Richter, H. Method for Combustion Synthesis of Fullerenes. Patent Application PCT/US02/27838, submitted on Aug. $31^{st}$ 2002.

Hummelen, J. C.; Knight, B. W.; LePeq, F.; Wudl, F. Preparation and Characterization of Fulleroid and Methanofullerene Derivatives. *J. Org. Chem.* 1995, 60, 532-538.

Kadish, K. M.; Ruoff, R. S. (ed.) Fullerenes: Chemistry, Physics and Technology. Wiley-Interscience, New York, 2000

Kitagawa, T.; Sakamoto, H.; Takeuchi, K. Electrophilic Addition of Polychloroalkanes to $C_{60}$: Direct Observation of Alkylfullerenyl Cation Intermediates. *J. Am. Chem. Soc.* 1999, 121, 4298-4299.

Koster, L. J. A.; Mihailetchi, V. D.; Blom, P. W. M. Ultimate Efficiency of Polymer/Fullerene Bulk Heterojunction Solar Cells. *Appl. Phys. Lett.* 2006, 88, 093511

Krätschmer, W.; Lamb, L. D.; Fostiropoulos, K.; and Huffman, D. R. Solid $C_{60}$: A New Form of Carbon. *Nature* 1990, 347, 354-358.

Lamparth, I.; Hirsch, A. Water-soluble Malonic Acid Derivatives of $C_{60}$ with a Defined Three-dimensional Structure. has been demonstrated successfully. *J. Chem. Soc., Chem. Commun.* 1994, 1727-1728.

McCullough, R. D.; Tristram-Nagle, S.; Williams, S. P.; Lowe, R. D.; Jayaraman, M. *J. Am. Chem. Soc.* 1993, 115, 4910

Perlin, John "The Silicon Solar Cell Turns 50" *NREL* 2004

Puplovskis, A.; Kacens, J.; Neilands, O. New Route for [60] Fullerene Functionalization in [4+2] Cycloaddition Reaction Using Indene. *Tetrahedron Lett.* 1997, 38, 285-288.

Richter, H.; Fonseca, A.; Emberson, S. C.; Gilles, J.-M.; B. Nagy, J.; Thiry, P. A.; Caudano, R.; Lucas, A. A. Fabrication of Fullerenes in Benzene/Oxygen/Argon- and Benzene/Acetylene/Oxygen/Argon Flames. *J. Chim. Phys.* 1995a, 92, 1272-1285.

Richter, H.; Fonseca, A.; Thiry, P. A.; Gilles, J.-M.; B. Nagy, J.; Lucas, A. A. Combustion Synthesis of Fullerenes. *Mat. Res. Soc. Symp. Proc.* 1995b, 359, 17-22.

Richter, H.; Hernadi, K.; Caudano, R.; Fonseca, A.; Migeon, H.-N.; B. Nagy, J.; Schneider, S.; Vandooren, J.; Van Tiggelen, P. J. Formation of Nanotubes in Low-pressure Hydrocarbon Flames. *Carbon* 1996a, 34, 427-429.

Richter, H.; Fonseca, A.; Gilles, J.-M.; B. Nagy, J.; Thiry, P. A.; Lucas, A. A.; de Hoffmann, E. Addition of HCl, $Cl_2$, $CoCl_2$ and KI to Fullerene forming Benzene/oxygen/argon Flames. *Synthetic Metals* 1996b, 77, 217-221.

Richter, H.; Labrocca, A. J.; Grieco, W. J.; Taghizadeh, K.; Lafleur, A. L.; Howard, J. B. Generation of Higher Fullerenes in Flames. *J. Phys. Chem. B* 1997, 101, 1556-1560.

Richter, H.; Grieco, W. J.; Howard, J. B. Formation Mechanism of Polycyclic Aromatic Hydrocarbons and Fullerenes in Premixed Benzene Flames. *Combust. Flame* 1999, 119, 1-22.

Richter, H.; Benish, T. G.; Mazyar, O. A.; Green, W. H.; Howard, J. B. Formation of Polycyclic Aromatic Hydrocarbons and their Radicals in a Nearly Sooting Premixed Benzene Flame. *Proc. Combust. Inst.* 2000, 28, 2609-2618.

Richter, H.; Howard, J. B. Formation and Consumption of Single-Ring Aromatic Hydrocarbons and their Precursors in Premixed Acetylene, Ethylene and Benzene Flames. *Phys. Chem. Chem. Phys.* 2002, 4, 2038-2055.

Richter, H.; Granata, S.; Green, W. H.; Howard, J. B. Detailed Modeling of PAH and Soot Formation in a Laminar Premixed Benzene/Oxygen/Argon Low-Pressure Flame. *Proc. Combust. Inst.* 2005b, 30, 1397-1405.

Richter, H.; Howard, J. B.; Vander Sande, J. B. From Academic Soot Research to Commercial Synthesis of Single-walled Carbon Nanotubes. AICHE Fall Meeting, Cincinnati, Nov. 2005a.

Richter, H.; Howard, J. B.; Vander Sande, J. B., Industrial Production of Fullerenic Materials. *Prepr. Pap.—Am. Chem. Soc., Div. Fuel Chem.* 2006, 51(1), 92.

Ruoff, R. S.; Tse, D. S.; Malhotra, R.; Lorents, D. C. Solubility of $C_{60}$ in a Variety of Solvents. *J. Phys. Chem.* 1993, 97, 3379-3383.

Tebbe, F. N.; Harlow, R. L.; Chase, D. B.; Thorn, D. L.; Campbell, Jr., G. C.; Calabrese, J. C.; Herron, N.; Young, Jr., R. J.; Wasserman, E. Synthesis and Single-Crystal X-ray Structure of a Highly Symmetrical $C_{60}$ Derivative, $C_{60}Br_{24}$. *Science* 1992, 256, 822-825.

Wienk, M. M.; Kroon, J. M.; Verhees, W. J. H.; Knol, J.; Hummelen, J. C.; van Hal, P. A.; Janssen, R. A. J.; Efficient Methano[70]fullerene/MDMO-PPV Bulk Heterojunction Photovoltaic Cells. *Angew. Chem. Int. Ed.* 2003, 42, 3371-3375.

Yang, et al., *Nature of Materials*, 2005, 4, 864-868

Yu, J.; Sumathi, R.; Green, W. H. Accurate and Efficient Method for Predicting Thermochemistry of Polycyclic Aromatic Hydrocarbons Bond Centered Group Additivity. *J. Am. Chem. Soc.* 2004, 126, 12685-12700.

Sixteen additional embodiments are provided as described in U.S. provisional application Ser. No. 60/812,961 filed Jun. 13, 2006 to Laird et al., which is incorporated by reference in its entirety:

Embodiment 1. A photovoltaic device comprising:
a first electrode,
a second electrode,
an least one active layer disposed between the first and second electrodes, wherein the active layer comprises at least one polythiophene and at least one fullerene derivative comprising an electron withdrawing group.

2. The device according to embodiment 1, wherein the fullerene derivative is a C60 fullerene.

3. The device according to embodiment 1, wherein the fullerene derivative is a C70 fullerene.

4. The device according to embodiment 1, wherein the fullerene derivative is a C84 fullerene.

5. The device according to embodiment 1, wherein the fullerene derivative comprises C60Cl6, C60(C9H8), C60Br24, C60Cl(CH2ClChCl2)

6. The device according to embodiment 1, wherein the polythiophene is a regioregular polythiophene.

7. The device according to embodiment 1, wherein the polythiophene is a copolymer.

8. The device according to embodiment 1, further comprising an HIL or HTL layer.

9. The device according to embodiment 1, wherein the polythiophene is a soluble regioregular polythiophene.

10. The device according to embodiment 1, wherein the electron withdrawing group also generates absorption in the visible spectrum.

11. A photovoltaic device comprising:
a first electrode,
a second electrode,
an least one active layer disposed between the first and second electrodes, wherein the active layer comprises at least one polythiophene and at least one fullerene derivative, wherein the fullerene derivative is a C70 or C84 fullerene.

12. A photovoltaic device comprising:
a first electrode,
a second electrode,
an least one active layer disposed between the first and second electrodes, wherein the active layer comprises at least one polythiophene and at least one fullerene derivative, wherein the fullerene derivative is a C70 fullerene.

13. A photovoltaic device comprising:
a first electrode,
a second electrode,
an least one active layer disposed between the first and second electrodes, wherein the active layer comprises at least one polythiophene and at least one fullerene derivative, wherein the fullerene derivative is a C84 fullerene.

14. A photovoltaic device comprising:
a first electrode,
a second electrode,
an least one active layer disposed between the first and second electrodes, wherein the active layer comprises at least one polythiophene and underivatized C70 fullerene.

15. A photovoltaic device comprising:
a first electrode,
a second electrode,
an least one active layer disposed between the first and second electrodes, wherein the active layer comprises at least one polythiophene and underivatized C84 fullerene.

16. A photovoltaic device comprising:
a first electrode,
a second electrode,
an least one active layer disposed between the first and second electrodes, wherein the active layer comprises at least one polythiophene and at least one fullerene derivative comprising o-quinodimethane derivative group.

WORKING EXAMPLES

Various claimed embodiments are described further with use of non-limiting working examples.

Example 1

Synthesis of $C_{60}$-Indene Adducts $C_{60}$ indene adducts have been synthesized using the description in reference (Puplovskis, et al., "New Route for [60]Fullerene Functionalization in [4+2] Cycloaddition Reaction Using Indene." *Tetrahedron Lett.* 1997, 38, 285-288) as starting point. $C_{60}$ was dissolved in o-dichlorobenzene at concentrations of approximately 6 mg mL$^{-1}$. Indene was added at 12-fold molar excess relative to $C_{60}$ and the resulting mixture was refluxed overnight. Most of the solvent was evaporated under reduced pressure and precipitation occurred after adding ethanol. The resulting solid was dried, re-dissolved in toluene and then analyzed by means of high-pressure liquid chromatography using a Cosmosil Buckyprep analytical column (250×4.6 mm, Nacalai Tesque, Inc.) mounted on an Agilent 1100 series instrument equipped with a variable wavelength detector operated at 330 nm. Toluene at a flow rate of 1 ml min$^{-1}$ was used for elution. Peaks at an elution time of approximately 5.4 min and a group of peak around 4 min were attributed to $C_{60}$-indene mono- and bis-adducts, respectively. The presence of several peaks with very close elution times around 4 min is consistent with the presence of several isomers. Elution times shorter than that of unfunctionalized C60 (about 8.1 min) have been observed previously with other fullerene derivatives such as $C_{60}$PCBM. Multiple additions were found to lead to a further decrease of elution times. A pentabromobenzyl-functionalized silica phase was used for purification by means of flash chromatography. Pure toluene and toluene/cyclo-hexane mixtures were used for purification. HPLC analysis of the collected fractions showed purities 98.5% for the $C_{60}$-indene monoadduct and approximately 95% for the mixture of different bis-adducts.

Example 2

Synthesis of $C_{70}$-Indene Monoadduct

C70-indene mono-adduct was synthesized following the procedure developed for the C60-indene adducts. $C_{70}$ was dissolved in o-dichlorobenzene. After addition of indene in a 12-fold molar excess, reflux was maintained for 8 h. After reduction of the volume under reduced pressure and addition of ethanol, solid was recovered, dried and re-dissolved in toluene. HPLC analysis using the same procedure as described above showed the presence of mainly mono-adduct, probably due to the reaction time, reduced in comparison to the $C_{60}$-adduct synthesis. Purification using flash chromatography led to the isolation of $C_{70}$-monoadduct at a purity of 98.6%. The corresponding HPLC chromatogram is given below. Two major isomers representing different addition sites on the $C_{70}$ cage have been identified.

Example 3

Preparation of Polythiophene

Plexcore P3HT was prepared as described in Loewe, et al. Adv. Mater. 1999, 11, 250-253 using 2,5-dibromo-3-hexylthiophene in place of 2,5-dibromo-dodecylthiophene, and using 0.0028 eq. of $Ni(dppp)Cl_2$ instead of 0.01 eq. The molecular weight as measured by GPC using chloroform as eluant was 69,000, 1.35 PDI.

Example 4

Fabrication of Solar Cell Device Using C60 Indene Adducts

Photovoltaic devices were prepared comprising (i) patterned indium tin oxide (ITO, anode, 60 Ω/square) on glass substrate purchased from Thin Film Devices (located in Anaheim, Calif.), (ii) a thin layer of HIL (30 nm thick) comprising PEDOT/PSS (AI4083) purchased from HC Stark), (iii) a 100 nm active layer comprising Plexcore P3HT (prepared as described in Example 3) blended with the n-type, which is either methanofullerence [6,6]-phenyl C61-butyric acid methyl ester (PCBM) (purchased from Nano-C, located in Westwood, Mass.), $C_{60}$-Indene mono adduct, or $C_{60}$-indene bis-adduct, (the fullerene adducts prepared as described in above examples), and (iv) a Ca/Al bilayer cathode.

The patterned ITO glass substrates were cleaned with detergent, hot water and organic solvents (acetone and alcohol) in an ultrasonic bath and treated with ozone plasma immediately prior to device layer deposition. The HIL solution (Baytron AI 4083) was then spin coated on the patterned ITO glass substrate to achieve a thickness of 30 nm. The film was dried at 150° C. for 30 mins in a nitrogen atmosphere. The active layer was formulated to a 1.2:1 weight ratio P3HT:n-type blend in o-dichlorobenzene (formulation was made to 0.024% volume solids) and was then spun on the top of the HIL film with no damage to the HIL (verified by AFM).

The film was then annealed at 175° C. for 30 mins in a glove box. Next, a 5 nm Ca layer was thermally evaporated onto the active layer through a shadow mask, followed by deposition of a 150 nm Al layer. The devices were then encapsulated via a glass cover slip (blanket) encapsulation sealed with EPO-TEK OG112-4 UV curable glue. The encapsulated device was cured under UV irradiation (80 mW/cm²) for 4 minutes and tested as follows.

The photovoltaic characteristics of devices under white light exposure (Air Mass 1.5 Global Filter) were measured using a system equipped with a Keithley 2400 source meter and an Oriel 300W Solar Simulator based on a Xe lamp with output intensity of 100 mW/cm² (AM1.5G). The light intensity was set using an NREL-certified Si-KG5 silicon photodiode.

The Jsc, Voc and efficiency measured for each device are shown in the table below compared to a control device which was made as described above using PCBM as the n-type material. The data are further illustrated in FIG. 4.

TABLE

Figure 4:
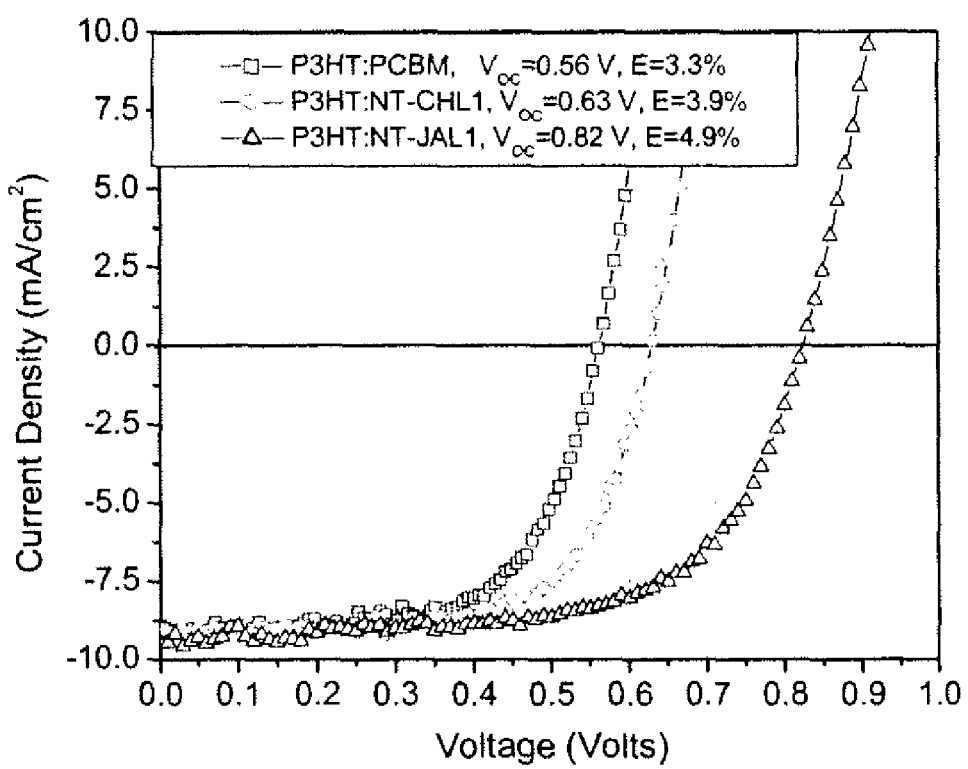
FIG. 4 provides photovoltaic data for devices comprising indene derivatives compared to a control.

| | FIG. 4 | Jsc (mA/cm²) | Voc (V) | FF | Efficiency (%) |
|---|---|---|---|---|---|
| Control | --□-- | 8.92 | 0.56 | 0.66 | 3.3 |
| Mono-indene adduct | --○-- | 9.20 | 0.63 | 0.67 | 3.9 |
| Bis-indene adduct | --Δ-- | 9.48 | 0.82 | 0.63 | 4.9 |
| Bis-indene adduct | | 9.43 | 0.84 | 0.64 | 5.1 |

What is claimed is:

1. A composition adapted for a photovoltaic device comprising a mixture comprising: (I) at least one p-type material, (ii) at least one n-type material, wherein the n-type material comprises a fullerene derivative represented by:

$$F^*—(R)_n$$

and solvates, salts, and mixtures thereof,
wherein n is 2,
F* comprises a fullerene having a surface which comprises six-membered and five-membered rings;
R is optionally substituted indene; and
wherein R is covalently bonded to the fullerene by two bonds.

2. The composition according to claim 1, wherein R is indene.

3. The composition according to claim 1, wherein R is covalently bonded to the fullerene by [4+2] cycloaddition.

4. The composition according to claim 1, wherein R is covalently bonded to the fullerene by two carbon-carbon bonds.

5. The composition according to claim 1, wherein R is covalently bonded to the fullerene by two carbon-carbon bonds at a fullerene [6,6] position.

6. The composition according to claim 1, wherein the fullerene comprises a C60, C70, or C84 fullerene, or a combination thereof.

7. The composition according to claim 1, wherein the fullerene comprises only carbon.

8. The composition according to claim 1, wherein the fullerene comprises at least one derivative group bonded to the fullerene besides R.

9. The composition according to claim 1, wherein the p-type material comprises a conjugated polymer.

10. The composition according to claim 1, wherein the p-type material comprises a conjugated polymer soluble or dispersible in organic solvent or water.

11. The composition according to claim 1, wherein the p-type material comprises a polythiophene.

12. The composition according to claim 1, wherein the p-type material comprises a regioregular polythiophene.

13. The composition according to claim 1, wherein the n-type and p-type materials are present in a ratio of from about 0.1 to 4.0 p-type to about 1 n-type, based on weight.

14. The composition according to claim 1, wherein the p-type material comprises polythiophene and the R group is optionally substituted indene, and the composition is in the form of a film having a film thickness of about 10 nm to about 300 nm.

15. The composition according to claim 1, wherein the p-type material comprises regioregular polythiophene and the R group is indene.

16. The composition according to claim 1, wherein the p-type material comprises regioregular polythiophene and the R group is indene and the composition further comprises at least two solvents.

17. A composition comprising a mixture comprising: (I) at least one p-type material, (ii) at least one n-type material, wherein the n-type material comprises at least one fullerene derivative comprising two [6,6] fullerene bonding sites wherein both carbon atoms of each [6,6] bonding site are covalently bonded to an optionally substituted indene.

18. The composition according to claim 17, wherein the group R comprises indene.

19. The composition according to claim 17, wherein the p-type material comprises a conjugated polymer.

20. The composition according to claim 17, wherein the p-type material comprises a polythiophene.

21. The composition according to claim 17, wherein the p-type material comprises a regioregular polythiophene.

22. The composition according to claim 17, wherein the p-type material comprises a regioregular polythiophene and the group R is optionally substituted indene.

23. A composition comprising a mixture comprising: (I) at least one p-type material, (ii) at least one n-type material, wherein the n-type material comprises a fullerene derivative comprising at least one fullerene covalently bonded by [4+2] cycloaddition to two optionally substituted indenes.

24. The composition according to claim 23, wherein the derivative moiety comprises indene.

25. The composition according to claim 23, wherein the p-type material comprises a conjugated polymer.

26. The composition according to claim 23, wherein the p-type material comprises a polythiophene.

27. The composition according to claim 23, wherein the p-type material comprises a regioregular polythiophene.

28. The composition according to claim 23, wherein the p-type material comprises a regioregular polythiophene and the derivative moiety is optionally substituted indene.

29. A photovoltaic device comprising at least one anode, at least one cathode, and at least one active layer, wherein the active layer comprises a composition adapted for a photovoltaic device comprising a mixture comprising: (I) at least one p-type material, (ii) at least one n-type material, wherein the n-type material comprises a fullerene derivative represented by:

and solvates, salts, and mixtures thereof, wherein n is 2; F* comprises a fullerene having a surface which comprises six-membered and five-membered rings; R is optionally substituted indene; and wherein R is covalently bonded to the fullerene by two bonds.

30. The device according to claim 29, wherein the device demonstrates an increase of efficiency of at least 5% compared to a substantially analogous device comprising an active layer of P3HT-PCBM.

31. The device according to claim 29, wherein the device demonstrates an increase of efficiency of at least 15% compared to a substantially analogous device comprising an active layer of P3HT-PCBM.

32. The device according to claim 29, wherein the device further comprises at least one hole injection layer.

33. The device according to claim 29, wherein the device further comprises at least one hole injection layer comprising a polythiophene.

34. The device according to claim 29, wherein the device further comprises at least one hole injection layer comprising a regioregular polythiophene.

35. The device according to claim 29, wherein the R group comprises an indene group.

36. The device according to claim 29, wherein the R group comprises an optionally substituted indene group, the p-type material comprises at least one regioregular polythiophene.

37. The device according to claim 29, wherein the R group comprises an optionally substituted indene group, the p-type material comprises at least one regioregular polythiophene, and the device further comprises a hole injection layer comprising a regioregular polythiophene.

\* \* \* \* \*